US012354655B2

(12) United States Patent
Yin et al.

(10) Patent No.: US 12,354,655 B2
(45) Date of Patent: Jul. 8, 2025

(54) TRANSIMPEDANCE AMPLIFIERS FOR CROSSBAR CIRCUITS (71) Applicant: TetraMem Inc., Fremont, CA (US)

(72) Inventors: Wenbo Yin, Alameda, CA (US); Ning Ge, Danville, CA (US)

(73) Assignee: TetraMem Inc., San Jose, CA (US)

(*) Notice: Subject to any disclaimer, the term of this patent is extended or adjusted under 35 U.S.C. 154(b) by 91 days.

(21) Appl. No.: 18/361,306

(22) Filed: Jul. 28, 2023

(65) Prior Publication Data

US 2025/0037763 A1     Jan. 30, 2025

(51) Int. Cl.
G11C 13/00       (2006.01)
H03F 3/45        (2006.01)

(52) U.S. Cl.
CPC ..... G11C 13/0026 (2013.01); H03F 3/45273 (2013.01); G11C 2213/79 (2013.01); H03F 2203/45344 (2013.01); H03F 2203/45702 (2013.01)

(58) Field of Classification Search
CPC ............ G11C 13/0026; G11C 2213/79; G11C 2013/0054; G11C 13/004; H03F 3/45273; H03F 2203/45344; H03F 2203/45702; H03F 3/45475
USPC ......................................................... 365/148
See application file for complete search history.

(56) References Cited

U.S. PATENT DOCUMENTS 5,929,658 A   7/1999  Cheung et al.
7,642,815 B2  1/2010  Fort
11,429,131 B2 * 8/2022  Nakatani ................... G05F 3/30
2012/0014170 A1  1/2012  Strukov et al.
2013/0223132 A1  8/2013  Perner
2019/0272886 A1  9/2019  Lucas et al.
2020/0380217 A1  12/2020  Kenney et al.

FOREIGN PATENT DOCUMENTS

WO      2016087763 A1    6/2016

OTHER PUBLICATIONS

International Searching Authority (ISA)/US, International Search Report for PCT/US2024/040086, mailed Oct. 16, 2024, 2 pages.
International Searching Authority (ISA)/US, Written Opinion for PCT/US2024/040086, mailed Oct. 16, 2024, 4 pages.

* cited by examiner

Primary Examiner — Huan Hoang
(74) Attorney, Agent, or Firm — JAFFERY WATSON HAMILTON & DESANCTIS LLP (57) ABSTRACT The present disclosure provides for transimpedance amplifiers for crossbar circuits. A crossbar circuit may include a plurality of bit lines intersecting with a plurality of word lines and a plurality of cross-point devices. Each of the plurality of the cross-point devices is connected to at least one of the word lines and at least one of the bit lines. The crossbar circuit may further include a transimpedance amplifier to generate an output voltage representative of a sum of currents flowing through a first bit line of the plurality of bit line. The transimpedance amplifier may include an operational amplifier, a current mirror circuit connected to an output of the operational amplifier, and one or more resistors connected to the current mirror circuit and a supply voltage.

13 Claims, 5 Drawing Sheets

TRANSIMPEDANCE AMPLIFIERS FOR CROSSBAR CIRCUITS

TECHNICAL FIELD

The implementations of the disclosure relate generally to electronic devices and, more specifically, to transimpedance amplifiers for crossbar circuits including resistive random-access memory (RRAM or ReRAM).

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus is provided. The apparatus includes a plurality of bit lines intersecting with a plurality of word lines; a plurality of cross-point devices; and a transimpedance amplifier. Each of the plurality of the cross-point devices is connected to at least one of the word lines and at least one of the bit lines. The transimpedance amplifier generates an output voltage representative of a sum of currents flowing through a first bit line of the plurality of bit lines. The transimpedance amplifier includes: an operational amplifier; a current mirror circuit connected to an output of the operational amplifier; and one or more resistors connected to the current mirror circuit and a supply voltage.

In some embodiments, the operational amplifier is a unity gain amplifier.

In some embodiments, a negative input of the operational amplifier is connected to the first bit line, wherein a positive input of the operational amplifier is connected to a reference voltage.

In some embodiments, the negative input of the operational amplifier is connected to the output of the operational amplifier in a unity feedback configuration.

In some embodiments, the apparatus further includes a switch positioned between the negative input of the operational amplifier and the output of the operational amplifier. The switch is configured to selectively connect the negative input of the operational amplifier to the output of the operational amplifier.

In some embodiments, the current mirror circuit includes a first transistor and a second transistor, wherein a first current flowing through the first transistor corresponds to the sum of the currents flowing through the first bit line, and wherein the first current is mirrored to a second current flowing through the second transistor.

In some embodiments, the output voltage generated by the transimpedance amplifier is represented as Vout=Vcc−I2*$R_{FB}$, wherein Vout is the output voltage generated by the transimpedance amplifier, wherein Vcc is the supply voltage, wherein I2 is the second current flowing through the second transistor; and wherein $R_{FB}$ represents the resistance of the one or more resistors connected to the current mirror circuit and the supply voltage.

In some embodiments, the output of the operational amplifier is electrically connected to a first source terminal of the first transistor. A second source terminal of the second transistor is electrically connected to at least one of the one or more resistors.

In some embodiments, a first gate terminal of the first transistor is electrically connected to a second gate terminal of the second transistor.

In some embodiments, a first drain terminal of the first transistor is electrically connected to a second drain terminal of the second transistor.

In some embodiments, the output voltage of the transimpedance amplifier is provided to an analog-to-digital converter (ADC).

In some embodiments, the one or more resistors are not in a feedback loop of the operational amplifier.

In some embodiments, the cross-point devices include at least one of a memristor, a phase-change memory (PCM) device, a floating gate device, a spintronic device, a ferroelectric device, or a resistive random-access memory (RRAM) device. The cross-point device may include a transistor or a dedicated device that functions as a selector.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Aspects of the disclosure provide transimpedance amplifiers for crossbar circuits. A crossbar circuit may include intersecting electrically conductive wires (e.g., row lines, column lines, etc.) and cross-point devices arranged in one or more arrays. Each of the cross-point devices may be connected to a row line and a column line. The cross-point devices may include, for example, a memristor, a phase-change memory (PCM) device, a floating gate device, a spintronic device, a ferroelectric device, or a resistive random-access memory (RRAM) device.

The crossbar circuit may perform vector matrix multiplication (VMM). For example, an input voltage may be applied to each selected row of the crossbar circuit. The input voltage may flow through the cross-point devices of the row of the crossbar circuit. The conductance of each cross-point device may be tuned to a specific value (also referred to as a "weight"). According to Ohm's law and Kirchhoff's current law, the input-output relationship of the crossbar circuit can be represented as I=VG, wherein I represents the output signal matrix as current; V represents the input signal matrix as voltage; and G represents the conductance matrix of the cross-point devices. As such, the input voltage is weighted at each of the cross-point devices by its conductance according to Ohm's law. The weighted current is output via each column wire and may be accumulated according to Kirchhoff's current law.

The crossbar circuits typically use a transimpedance amplifier (TIA) to convert the accumulated current to an analog voltage and then convert the voltage to a digital output. The stability and performance of conventional TIAs may be significantly impacted by the complex capacitive loadings and current variations, both of which can fluctuate dramatically during VMM operations. This stability challenge is compounded by the interaction between operational amplifiers in the crossbar circuit (e.g., operational amplifiers used to implement analog-to-digital converters and/or digital-to-analog converters), the varying current loads, and the varying voltages applied to the cross-point devices.

The present disclosure provides a TIA that may be incorporated into a crossbar circuit. The transimpedance amplifier may include an operational amplifier; a current mirror circuit connected to an output of the operational amplifier; and one or more resistors connected to the current mirror circuit and a supply voltage. The resistors connected to the current mirror circuit are not in a feedback loop of the operational amplifier. In some embodiments, the operational amplifier is a unity gain amplifier. The negative and positive inputs of the operational amplifier may be connected to a bit line of the crossbar circuit and a reference voltage, respectively. The current mirror circuit may include a first transistor and a second transistor. A first current flowing through the first transistor may correspond to the sum of the currents flowing through the bit line connected to the TIA. The first current may be mirrored to a second current flowing through the second transistor. The output of the TIA relates to the supply voltage, the resistance of the resistors connected to the current mirror circuit, and the second current flowing through the second transistor.

Unlike the conventional TIAs, the TIA described herein may generate an output voltage that is not impacted by the capacitive loadings and the current variations of the crossbar circuit. By removing the feedback resistors and load from the operational amplifier loop to the mirrored node of the current mirror circuit, the TIA design described herein may improve the overall circuit stability of a crossbar circuit incorporating the TIA design.

Figure 1:
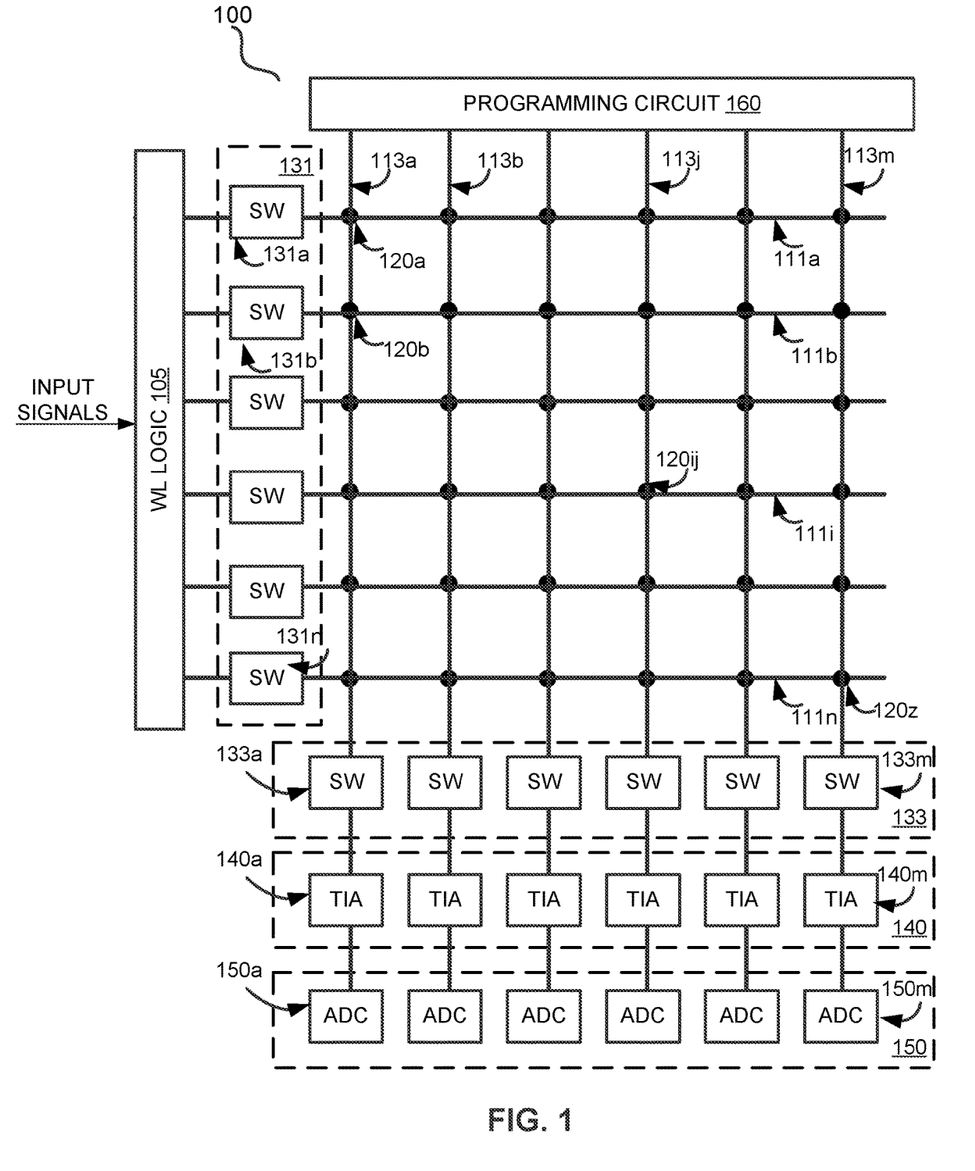
FIG. 1 is a diagram illustrating an example of a crossbar circuit in accordance with some embodiments of the present disclosure.

FIG. 1 is a diagram illustrating an example 100 of a crossbar circuit in accordance with some embodiments of the present disclosure. As shown, crossbar circuit 100 may include a plurality of interconnecting electrically conductive wires, such as one or more row wires 111a, 111b, ..., 111i, ..., 111n, and column wires 113a, 113b, ..., 113j, ..., 113m for an n-row by m-column crossbar array. The crossbar circuit 100 may further include cross-point devices 120a, 120b, ..., 120z, etc. Each of the cross-point devices may connect a row wire and a column wire. For example, the cross-point device 120ij may connect the row wire 111i and the column wire 113j. The number of the column wires 113a-m and the number of the row wires 111a-n may or may not be the same. Crossbar circuit 100 may further include a word line (WL) logic 105 that is connected to the cross-point devices via the row wires 111a-n. The WL logic 105 may include any suitable component for applying input signals to selected cross-point devices via row wires 111a-n, such as one or more digital-to-analog converters (DACs), amplifiers, etc. Each of the input signals may be a voltage signal, a current signal, etc.

Row wires 111a-n may include a first row wire 111a, a second row wire 111b, ..., 111i, ..., and an n-th row wire 111n. Each of row wires 111a, ..., 111n may be and/or include any suitable electrically conductive material. In some embodiments, each row wire 111a-n may be a metal wire. In some embodiments, each row wire 111a-n may be a word line.

Column wires 113a-m may include a first column wire 113a, a second column wire 113b, ..., and an m-th column wire 113m. Each column wire 113a-m may be and/or include any suitable electrically conductive material. In some embodiments, each column wire 113a-m may be a metal wire. In some embodiments, each column wire 113a-m may be a bit line.

Each cross-point device 120a-z may be and/or include any suitable device with tunable resistance, such as a memristor, phase-change memory (PCM) devices, floating gates, spintronic devices, ferroelectric devices, RRAM devices, etc.

Each row wire 111a-n may be connected to one or more row switches 131 (e.g., row switches 131a, 131b, ..., 131n). Each row switch 131 may include any suitable circuit structure that may control the current flowing through row wires 111a-n. For example, row switches 131 may be and/or include a CMOS switch circuit.

Each column wire 113a-m may be connected to one or more column switches 133 (e.g., switches 133a, ..., 133m). Each column switches 133a-m may include any suitable circuit structure that may control current passing through column wires 113a-m. For example, column switches 133a-m may be and/or include a CMOS switch circuit. In some embodiments, one or more of switches 131a-n and 133a-m may further provide fault protection, electrostatic discharge (ESD) protection, noise reduction, and/or any other suitable function for one or more portions of crossbar circuit 100.

Output sensor(s) 140 may include any suitable component for converting the current flowing through column wires 113a-n into the output signal, such as one or more TIAs (trans-impedance amplifier) 140a, 140m. Each TIAs 140a-m may convert the current flowing through a respective column wire into a respective voltage signal. Each ADC 150 (e.g., ADC 150a, ..., 150m) may convert the voltage signal produced by its corresponding TIA into a digital output. In some embodiments, output sensor(s) 140 may further include one or more multiplexers (not shown). In some embodiments, each of TIAs 140a-m may include a TIA 400 as described in connection with FIG. 4.

The programming circuit 160 may program the cross-point devices 120a-z selected by switches 131 and/or 133 to suitable conductance values. For example, programming a cross-point device may involve applying a suitable voltage signal or current signal across the cross-point device. The resistance of each cross-point device may be electrically switched between a high-resistance state and a low-resistance state. Setting a cross-point device may involve switching the resistance of the cross-point from the high-resistance state to the low-resistance state. Resetting the cross-point device may involve switching the resistance of the cross-point from the low-resistance state to the high-resistance state.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the sum of the currents passes through the activated cross-point devices on a respective column (also referred to as the "bit line current"), which may be read from the column. According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current (the "bit line current") is output via each column wire and may be accumulated according to Kirchhoff's current law. This may enable in-memory computing (IMC) via parallel multiplications and summations performed in the crossbar arrays.

Crossbar circuit 100 may be configured to perform vector-matrix multiplication (VMM). A VMM operation may be represented as Y=XA, wherein each of Y, X, A represents a respective matrix. More particularly, for example, input vector X may be mapped to the input voltage V of crossbar circuit 100. Matrix A may be mapped to conductance values G. The output current I may be read and mapped back to output results Y. In some embodiments, crossbar circuit 100 may be configured to implement a portion of a neural network by performing VMMs.

In some embodiments, crossbar circuit 100 may perform convolution operations. For example, performing 2D convolution on input data may involve applying a single convolution kernel to the input signals. Performing a depth-wise convolution on the input data may involve convolving each channel of the input data with a respective kernel corresponding to the channel and stacking the convolved outputs together. The convolution kernel may have a particular size defined by multiple dimensions (e.g., a width, a height, a channel, etc.). The convolution kernel may be applied to a portion of the input data having the same size to produce an output. The output may be mapped to an element of the convolution result that is located at a position corresponding to the position of the portion of the input data.

The programming circuit 160 may program the crossbar circuit 100 to store convolution kernels for performing 2D convolution operations. For example, a convolution kernel may be converted into a vector and mapped to a plurality of cross-point devices of the crossbar array that are connected to a given bit line. In particular, the conductance values of the cross-point devices may be programmed to values representative of the convolution kernel. In response to the input signals, the crossbar circuit 100 may output, via the given bit line, a current signal representative of a convolution of the input signals and the 2D convolution kernel. In some embodiments, crossbar circuit 100 may store multiple 2D convolution kernels by mapping each of the 2D convolution kernels to the cross-point devices connected to a respective bit line. Crossbar circuit 100 may output a plurality of output signals (e.g., current signals) representative of the convolution results via column wires 113*a-m*.

Figure 2A:
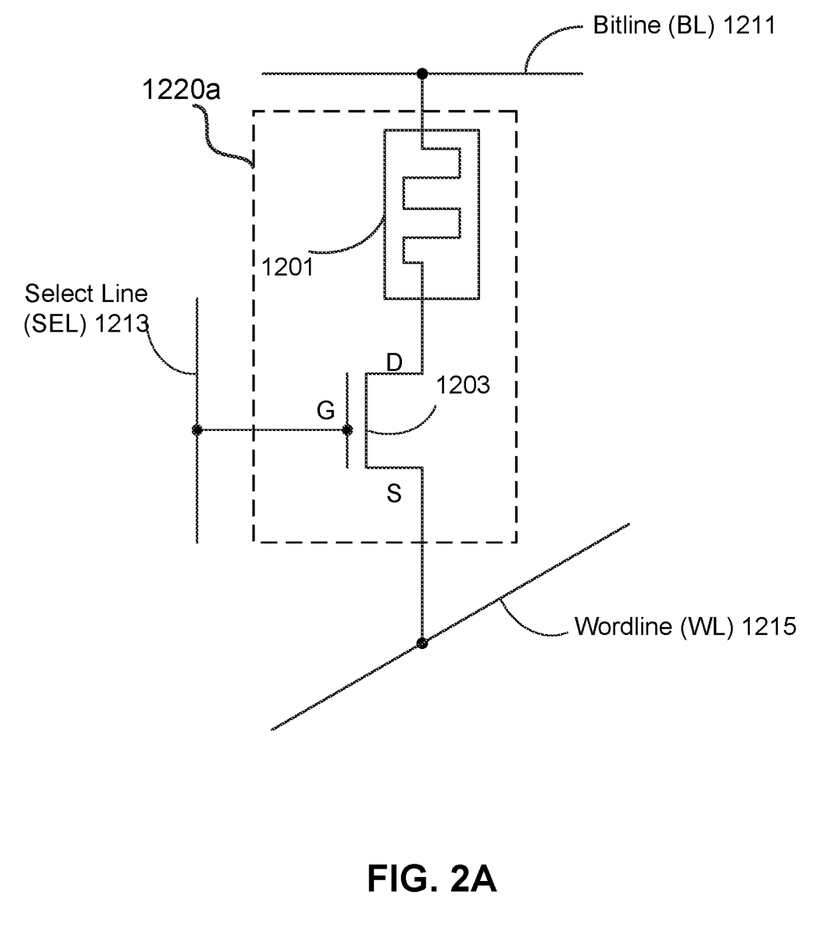
FIGS. 2A and 2B are schematic diagrams illustrating example cross-point devices in accordance with some embodiments of the present disclosure.
Figure 2B:
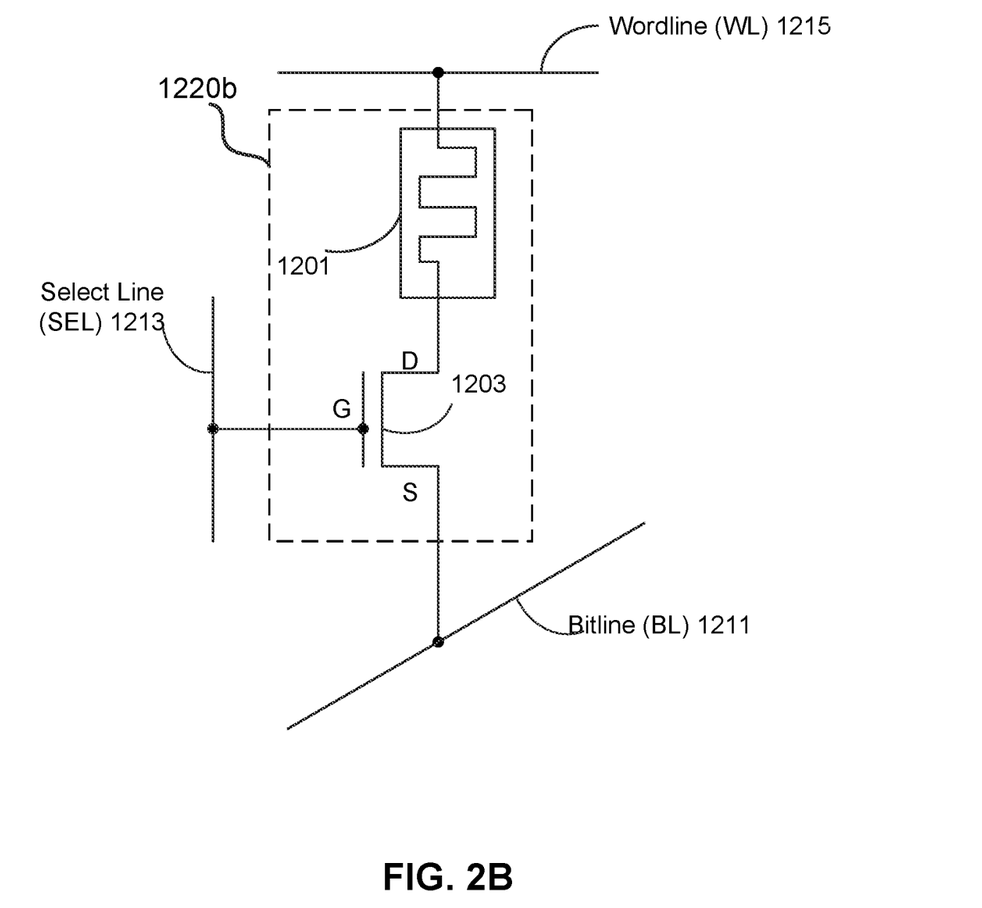

FIGS. 2A and 2B are schematic diagrams illustrating example cross-point devices 1220*a* and 1220*b* in accordance with some embodiments of the present disclosure. Each of cross-point devices 1220*a* and 1220*b* may be referred to as a 1-transistor-1-resistor (1T1R) configuration.

As shown in FIGS. 2A and 2B, a cross-point device 1220*a-b* may include an RRAM device 1201 and a transistor 1203 that are connected in series. A transistor may include three terminals that may be marked as gate (G), source(S), and drain (D), respectively. Referring to FIG. 2A, a first terminal of RRAM device 1201 may be connected to the drain of transistor 1203. A second terminal of RRAM device 1201 may be connected to a bit line 1211. The source of the transistor 1203 may be connected to a word line 1215. The gate of transistor 1203 may be connected to a select line 1213.

As shown in FIG. 2B, the second terminal of RRAM device 1201 may be connected to a word line 1215, and the source of the transistor 1203 may be connected to a bit line 1211 in some embodiments. Word line 1215 may correspond to a row wire 111*a-n* of FIG. 1. Bit line 1211 may correspond to a column wire 123*a-m* of FIG. 1.

Transistor 1203 may function as a selector as well as a current controller and may set the current compliance to RRAM device 1201 during programming. The gate voltage on transistor 1203 can set current compliances to cross-point device 1220*a-b* during programming and can thus control the conductance and analog behavior of cross-point device 1220*a-b*. For example, when cross-point device 1220*a-b* is set from a high-resistance state to a low-resistance state, a set signal (e.g., a voltage signal, a current signal) may be provided via bit line (BL) 1211 or word line (WL) 1215. Another voltage, also referred to as a select voltage or gate voltage, may be applied via select line (SEL) 1213 to the transistor gate to open the gate and set the current compliance, while word line (WL) 1215 or bit line (BL) may be grounded. When cross-point device 1220*a-b* is reset from the low-resistance state to the high-resistance state, a gate voltage may be applied to the gate of transistor 1203 via select line 1213 to open the transistor gate. Meanwhile, a reset signal may be sent to RRAM device 1201 via word line 1215 or bit line 1211, while bit line 1211 or word line 1215 may be grounded.

Figure 3:
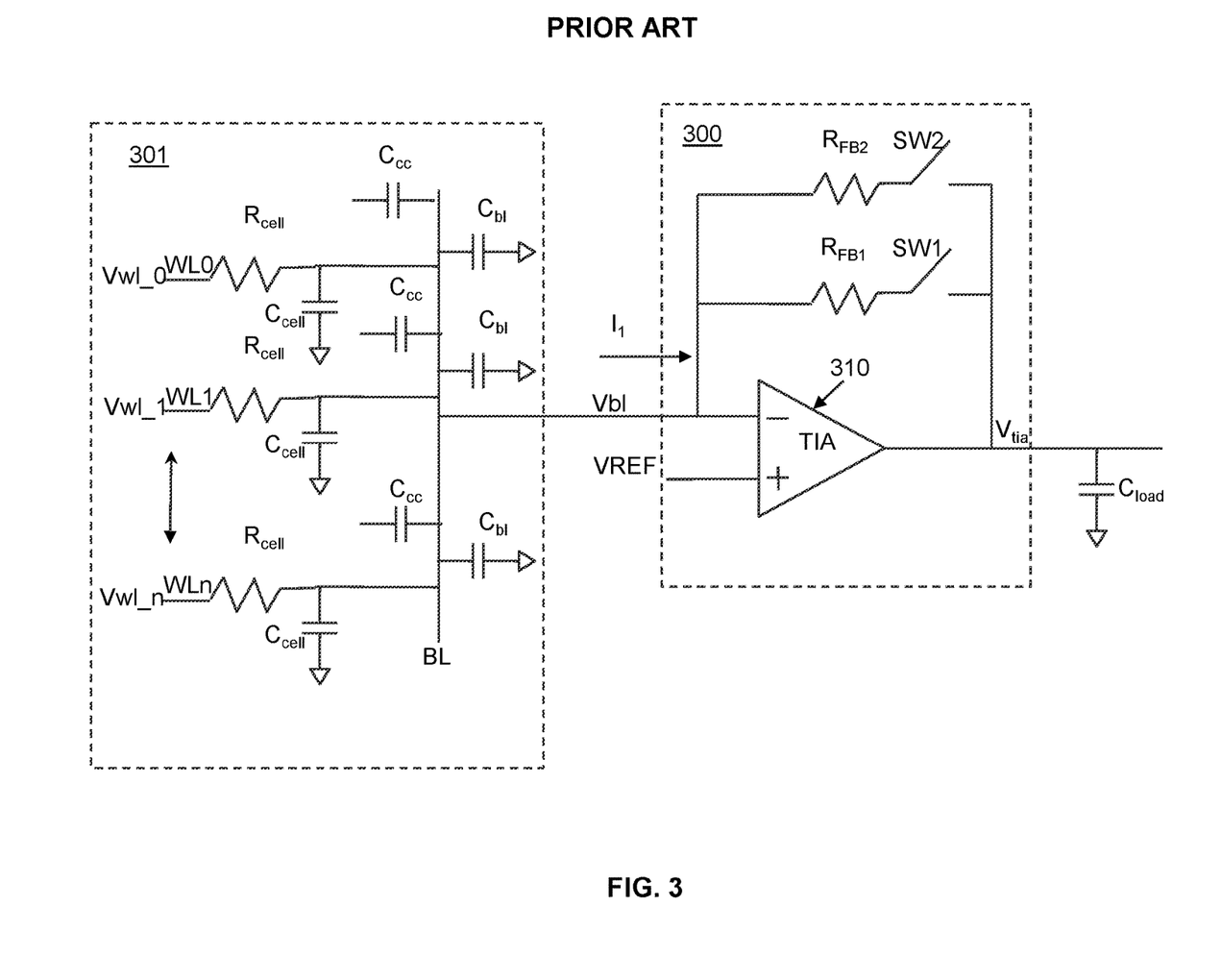
FIG. 3 is a schematic diagram illustrating a prior art transimpedance amplifier.

FIG. 3 is a schematic diagram illustrating a conventional TIA 300. The TIA 300 may include an operational amplifier 310 and feedback resistors (e.g., resistors $R_{FB1}$ and $R_{FB2}$).

As illustrated in FIG. 3, circuit 301 is an equivalent circuit of a portion of the crossbar circuit 100 as described in connection with FIG. 1. Circuit 301 may include a plurality of word lines WL0, WL1, . . . , WLn connected to a bit line BL. Each of the word lines may correspond to a row wire 111*a-n* of FIG. 1. The bit line BL may correspond to a column wire 113*a-m* of FIG. 1. A cross-point device 120*a-z* of FIG. 1 may be represented by a resistor $R_{cell}$ and a capacitor $C_{cell}$. $C_{bl}$ may represent the capacitance of the bit line. $C_{cc}$ may represent the capacitance of neighboring word lines and/or select lines. $C_{load}$ may represent the loading capacitance of an ADC (not shown in FIG. 3) and/or other component of the crossbar circuit connected to the TIA 300.

The inputs of the operational amplifier 310 are connected to the bit line BL and a reference voltage Vref, respectively. One or more cross-point devices connected to the bit line BL may be selected and/or enabled for programming and/or in-memory computing. An input voltage (e.g., Vwl_0, Vwl_1 . . . , Vwl_n as shown in FIG. 3) may be applied to the selected cross-point devices via the word lines connected to the selected cross-point devices.

The TIA 300 utilizes the operational amplifier 310 to force the input voltage line to be at a reference level VREF. The output of the TIA 300 may be calculated based on the following equation:

$$Vtia = V_{REF} - I1 * R_{FB}, \qquad (1)$$

where VREF is the reference voltage; I1 is the bit line current; and $R_{FB}$ is the resistance of the feedback resistors in the feedback loop of the operational amplifier 310. The operation and performance of the TIA 300 may be significantly impacted by the complex capacitive loadings in the loop of the TIA 300 (e.g., $C_{cell}$, $C_{bl}$, $C_{cc}$, $C_{load}$, etc.) and current variations in loop. The capacitive loading, for example, is related to the number of word lines activated, thereby impacting the TIA. This factor is tied to the frequency response, and the number of word lines activated can also affect other lines in the circuit. In a large-scale crossbar circuit, such as a crossbar circuit with 256 rows and 256 columns, the variation of capacitive loading can be substantial, given the numerous combinations of word lines and bit lines that can be open at any time. Additionally, the current loading may vary dramatically due to the different resistances across columns and rows of the crossbar circuit. For instance, a 256-row column may include 256 different resistors, each with a different programmed weight. Therefore, the current can vary significantly across the circuit. This combination of varying capacitive and current loading makes it incredibly challenging to ensure the stability of the transimpedance amplifier.

Figure 4:
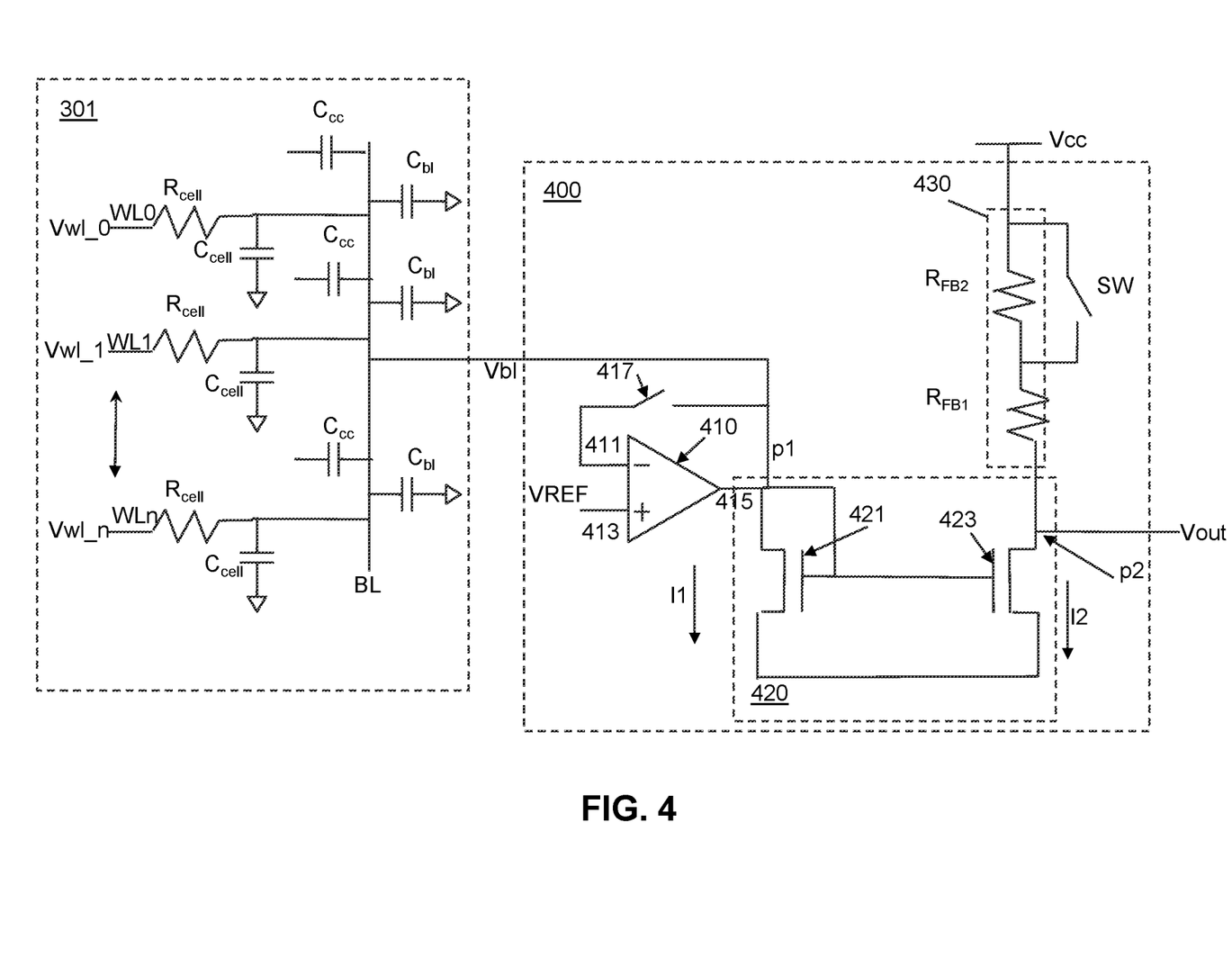
FIG. 4 is a schematic diagram illustrating an example transimpedance amplifier in accordance with some embodiments of the present disclosure.

FIG. 4 is a schematic diagram illustrating an example TIA 400 in accordance with some embodiments of the present disclosure.

As shown, TIA 400 may include an operational amplifier 410, a current mirror circuit 420, and one or more resistors 430 (e.g., resistors $R_{FB1}$, $R_{FB2}$, etc.). A first input 411 (e.g., the negative input) of the operational amplifier 410 may be electrically connected to the bit line BL of the crossbar circuit. As described above, one or more cross-point devices connected to the bit line are selected and/or enabled for programming and/or in-memory computing. An input voltage may be applied to the selected cross-point devices via the word lines connected to the selected cross-point devices.

A second input 413 (e.g., the positive input) of the operational amplifier 410 may be electrically connected to a reference voltage (Vref as shown in FIG. 4). An output 415 of the operational amplifier 410 may be electrically connected to the current mirror circuit 420. In some embodiments, the operational amplifier 410 may be a unity gain amplifier. The negative input 411 of the operational amplifier 410 may be connected to the output 415 of the operational amplifier in a unity feedback configuration. In some embodiments, a switch 417 is positioned between the negative input 411 and the output 415 of the operational amplifier. The switch 417 may selectively connect the negative input 411 to the output 415 of the operational amplifier.

The current mirror circuit 420 may include a first transistor 421, a second transistor 423, and/or any other suitable component for mirroring and inverting a current. The gate terminal of the first transistor 421 (also referred to as the "first gate terminal") may be connected to the gate terminal of the second transistor 423 (also referred to as the "second gate terminal"). The output 415 of the operational amplifier 410 may be connected to the source terminal of the first transistor 421 (also referred to as the "first source terminal") of the first transistor 421. The drain terminal of the first transistor 421 (also referred to as the "first drain terminal") may be connected to the drain terminal of the second transistor 423 (also referred to as the "second drain terminal"). The source terminal of the second transistor 423 (also referred to as the "second source terminal") may be electrically connected to one or more resistors 430. The resistors 430 may be connected to a supply voltage Vcc.

A first current I1 flowing through the first transistor 421 may correspond to the bit line current. The first current I1 may be mirrored from a high-frequency node P1 to the right side of the current mirror circuit 420 (also referred to as the "mirrored node of the current mirror circuit 420") as a second current I2. That is, the current mirror circuit 420 may reverse the direction of the first current I1. In some embodiments, the amplitude of the second current I2 is greater than the amplitude of the first current I1. In some embodiments, the amplitudes of the second current I2 and the first current I1 may be the same or approximately the same.

The output voltage Vout of the TIA 400 may be determined based on the following equation:

$$Vout = Vcc - I2 * R_{FB}, \qquad (2)$$

where Vcc is the supply voltage; I2 is the second current flowing through the second transistor 423; and $R_{FB}$ represents the resistance of the feedback resistors. The value of $R_{FB}$ may be adjusted by connecting one or more resistors $R_{FB1}$, $R_{FB2}$, etc. to the mirrored node of the current mirror circuit 420. As such, the output voltage produced by the TIA 400 is not impacted by the capacitive loadings and the current variations of the crossbar circuit.

The output voltage Vout may be fed into an ADC (e.g., an ADC150a-n of FIG. 1) that may generate a digital output based on the output voltage Vout. Unlike the conventional TIAs (e.g., TIA 300) that utilize an operational amplifier to force the voltage line to be at a reference level, the TIA 400 may generate an output voltage that relates to the supply voltage Vcc, which may be adjusted in a larger dynamic range than the reference voltage VREF utilized by the conventional TIAs. This may effectively increase the dynamic range of the ADC, thus improving the ADC's performance and allowing a relaxed ADC design.

The output voltage Vout corresponds to the voltage at node P2 as illustrated in FIG. 4. The node P2 is an open loop pole given that there is no feedback on the P2 node. As such, the loading of the crossbar circuit and the loading of the ADC connected to the TIA 400 have no impact on the output voltage Vout. By removing the feedback resistors and load from the operational amplifier loop to the mirrored node of the current mirror circuit, the TIA design described herein may improve the overall circuit stability of a crossbar circuit incorporating the TIA design.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
   a plurality of bit lines intersecting with a plurality of word lines;
   a plurality of cross-point devices, wherein each of the plurality of the cross-point devices is connected to at least one of the word lines and at least one of the bit lines; and
   a transimpedance amplifier that generates an output voltage representative of a sum of currents flowing through a first bit line of the plurality of bit lines, wherein the transimpedance amplifier comprises:
   an operational amplifier;
   a current mirror circuit connected to an output of the operational amplifier; and
   one or more resistors connected to the current mirror circuit and a supply voltage.

2. The apparatus of claim 1, wherein the operational amplifier is a unity gain amplifier.

3. The apparatus of claim 2, wherein a negative input of the operational amplifier is connected to the first bit line, wherein a positive input of the operational amplifier is connected to a reference voltage.

4. The apparatus of claim 3, wherein the negative input of the operational amplifier is connected to the output of the operational amplifier.

5. The apparatus of claim 1, wherein the current mirror circuit comprises a first transistor and a second transistor, wherein a first current flowing through the first transistor corresponds to the sum of the currents flowing through the first bit line, and wherein the first current is mirrored to a second current flowing through the second transistor.

6. The apparatus of claim 5, wherein the output voltage generated by the transimpedance amplifier is represented as:

$$Vout = Vcc - I*R_{FB},$$

wherein Vout is the output voltage generated by the transimpedance amplifier, wherein Vcc is the supply voltage, wherein I is the second current flowing through the second transistor; and wherein $R_{FB}$ represents resistance of the one or more resistors connected to the current mirror circuit and the supply voltage.

7. The apparatus of claim 5, wherein the output of the operational amplifier is connected to a first source terminal of the first transistor, and wherein a second source terminal of the second transistor is electrically connected to at least one of the resistors.

8. The apparatus of claim 7, wherein a first gate terminal of the first transistor is electrically connected to a second gate terminal of the second transistor.

9. The apparatus of claim 7, wherein a first drain terminal of the first transistor is connected to a second drain terminal of the second transistor.

10. The apparatus of claim 1, wherein the output voltage of the transimpedance amplifier is provided to an analog-to-digital converter.

11. The apparatus of claim 1, wherein the one or more resistors are not in a feedback loop of the operational amplifier.

12. The apparatus of claim 1, wherein the cross-point devices comprise at least one of a memristor, a phase-change memory (PCM) device, a floating gate device, a spintronic device, a ferroelectric device, or a resistive random-access memory (RRAM) device.

13. The apparatus of claim 1, further comprising a switch configured to selectively connect a negative input of the operational amplifier to the output of the operational amplifier.

* * * * *